(12) United States Patent
Wu

(10) Patent No.: US 12,327,752 B2
(45) Date of Patent: Jun. 10, 2025

(54) MOTION DEVICE WITH MAGNETIC LEVITATION FOR WAFER LOADING AND UNLOADING

(71) Applicant: YINGUAN SEMICONDUCTOR TECHNOLOGY CO., LTD., Shanghai (CN)

(72) Inventor: Huoliang Wu, Shanghai (CN)

(73) Assignee: YINGUAN SEMICONDUCTOR TECHNOLOGY CO., LTD., Shanghai (CN)

( * ) Notice: Subject to any disclaimer, the term of this patent is extended or adjusted under 35 U.S.C. 154(b) by 875 days.

(21) Appl. No.: 17/594,766

(22) PCT Filed: Apr. 23, 2020

(86) PCT No.: PCT/CN2020/086368
§ 371 (c)(1),
(2) Date: Oct. 28, 2021

(87) PCT Pub. No.: WO2020/221096
PCT Pub. Date: Nov. 5, 2020

(65) Prior Publication Data
US 2022/0216088 A1 Jul. 7, 2022

(30) Foreign Application Priority Data

Apr. 30, 2019 (CN) .......................... 201910363238.3
Jul. 12, 2019 (CN) .......................... 201910628196.1

(51) Int. Cl.
*H01L 21/683* (2006.01)
*B25B 11/00* (2006.01)
(Continued)

(52) U.S. Cl.
CPC ........ *H01L 21/6838* (2013.01); *B25B 11/005* (2013.01); *H01L 21/68* (2013.01); *H01L 21/68742* (2013.01); *H01L 21/68764* (2013.01)

(58) Field of Classification Search
CPC ... B25B 11/005; H01L 21/68; H01L 21/6838; H01L 21/68742; H01L 21/68764;
(Continued)

(56) References Cited

U.S. PATENT DOCUMENTS 6,779,278 B1 * 8/2004 Spady ............... H01L 21/68792
414/936
2004/0246012 A1 12/2004 Dvir et al.

FOREIGN PATENT DOCUMENTS

CN 101177199 A * 5/2008
CN 102129175 A 7/2011
(Continued)

OTHER PUBLICATIONS

Office Action issued in corresponding Japanese Application No. 2021-564750, dated Dec. 20, 2022, with English translation.
(Continued)

*Primary Examiner* — C. A. Rivera
(74) *Attorney, Agent, or Firm* — HSML P.C.

(57) ABSTRACT

A motion device includes a tray; a rotary stage located below the tray, with an annular upper cavity provided on the upper surface thereof, and with a lower cavity provided on the lower surface thereof. Projections of the annular upper cavity and the lower cavity in the projection direction perpendicular to the upper surface of the rotary stage do not overlap. The device also includes a rotary motor accommodated in the annular upper cavity and includes a rotor of the rotary motor and a stator of the rotary motor. The stator is fixed with respect to the rotary stage, and the rotor is fixed
(Continued)

with respect to the tray. The device also includes a vertical movable device in the lower cavity configured to drive the rotary stage to move vertically; a levitation gravity offsetting device located in the lower cavity and configured to offset the gravity of the rotary stage.

10 Claims, 5 Drawing Sheets

(51) Int. Cl.
*H01L 21/68* (2006.01)
*H01L 21/687* (2006.01)

(58) Field of Classification Search
CPC ......... H01L 21/68792; H01L 21/67766; H01L 21/68785
See application file for complete search history.

(56) References Cited

FOREIGN PATENT DOCUMENTS

| | | | |
|---|---|---|---|
| CN | 110176407 A | | 8/2019 |
| EP | 0867773 A2 | * | 9/1998 |
| JP | H10270535 A | | 10/1998 |
| JP | 2002323584 A | * | 11/2002 ......... G03F 7/70716 |

OTHER PUBLICATIONS

International Search Report and Written Opinion issued in PCT/CN2020/086368, dated Jul. 29, 2020, with English translation.

* cited by examiner

MOTION DEVICE WITH MAGNETIC LEVITATION FOR WAFER LOADING AND UNLOADING

CROSS-REFERENCE TO RELATED APPLICATIONS

This patent application claims the priority of the Chinese patent application No. 201910363238.3 filed on Apr. 30, 2019 and titled "Motion device", and a Chinese patent application No. 201910628196.1 filed on Jul. 12, 2019 and titled "Motion device", the full disclosure of the above applications are incorporated herein by reference.

TECHNICAL FIELD

This invention relates to integrated circuit equipment manufacturing, and in particular to a motion device which can provide high-precision vertical movement and rotation functions.

TECHNICAL BACKGROUND

In the art of semiconductor wafer film thickness detection, it is required that the workpiece stage can complete the transfer of the wafer with the wafer transfer system, and at the same time, the workpiece stage is required to rotate by 360° and move vertically when carrying a 12-inch or 8-inch wafer to complete the wafer film thickness detection. Therefore, for the workpiece stage device used in film thickness detection, the rotation/vertical movable stage is the core component. With the continuous improvement of the requirements for productivity and the continuous improvement of film thickness detection precision, the operating speed, acceleration and performance of the workpiece stage have also increased. This requires a more lightweight, flatter, and higher movement precision design for the workpiece stage. In the US patent US2004246012A1, a workpiece stage solution in this art is proposed. The vertical movable stage (support stage 112) of this invention is fixed on the vertical device, and the chuck unit is fixed on the vertical movable stage. And, the vertical device is driven to move vertically by a linear motor driving the wedge block and the reciprocating force provided by two 0.5 mm thick reeds. The structure of the invention is relatively simple, but the height dimension is relatively large and it is difficult to be made flat.

In the U.S. Pat. No. 6,779,278B1, a workpiece stage solution in this art is proposed. The vertical movable stage (Z stage) of this invention is fixed on the vertical device, and the chuck unit is fixed on the vertical movable stage. The vertical device is directly driven by the voice coil motor, and the gravity of the stage is offset by the spring, which reduces the load of the voice coil motor. The structure of the invention is relatively simple, the vertical dimension is relatively small and the low profile design is basically realized. However, since the voice coil motor uses a spring for gravity offsetting, it is difficult to achieve high precision in vertical movement.

Therefore, in the field of integrated circuit equipment manufacturing, there is a need for a precise motion device that can achieve a low profile and at the same time solve the problem of low vertical movement precision.

SUMMARY

The invention solves the problem of relatively large height size of the motion device in the prior art by providing a precise motion device with a low profile structure, realizes a low profile design, and solves the problem of low vertical movement precision.

In particular, this invention solves the above-mentioned problems by providing a motion device, which includes:
 a tray;
 a rotary stage, which is located below the tray, the upper surface of the rotary stage is provided with an annular upper cavity, the lower surface of the rotary stage is provided with a lower cavity, wherein the projections of the annular upper cavity and the lower cavity in the projection direction perpendicular to the upper surface of the rotary stage are not overlapped with each other;
 a rotary motor, which is accommodated in the annular upper cavity, the rotary motor including a rotor of the rotary motor and a stator of the rotary motor, the stator of the rotary motor being fixed with respect to the rotary stage, and the rotor of the rotary motor being fixed with respect to the tray;
 a vertical movable device, which is located in the lower cavity and configured to drive the rotary stage to move vertically; and
 a magnetic levitation gravity offsetting device, which is located in the lower cavity and configured to offset the gravity of the rotary stage.

In an embodiment, the vertical movable device and the magnetic levitation gravity offsetting device are integrated with each other and are located in the lower cavity.

In an embodiment, the lower cavity includes a plurality of lower cavities, and the vertical movable device and the magnetic levitation gravity offsetting device are respectively located in different lower cavities.

In an embodiment, the plurality of lower cavities comprising a central cavity and peripheral cavities, the plane position of the central cavity is surrounded by the annular upper cavity and is used for accommodating the vertical movable device; the peripheral cavities are located on the outer periphery of the annular upper cavity and is used for accommodating the magnetic levitation gravity offsetting device.

In an embodiment, the motion device further comprising a wafer loading and unloading device configured to place a workpiece on the tray or remove the workpiece from the tray.

In an embodiment, the vertical motion device comprises a voice coil motor that is a hollow structure, and the tray is a vacuum chuck device.

In an embodiment, the lower cavity comprises four peripheral cavities each accommodating a magnetic levitation gravity offsetting device.

In an embodiment, the structure in which the vertical motion device and the magnetic levitation gravity offsetting device are integrated with each other comprising:
 a voice coil motor stator, the outer surface of the voice coil motor stator is surrounded with an inner magnetic ring; and
 a voice coil motor mover, the outer surface of the voice coil motor mover is surrounded with an outer magnetic ring.

In one embodiment, the rotary stage includes: a rotation grating scale located in the annular upper cavity.

In one embodiment, the rotary stage includes: only one bearing is provided between the rotor of the rotary motor and the inner peripheral wall of the annular upper cavity.

In the prior motion device capable of realizing multi-dimensional motion, the parts for realizing the rotational movement and the vertical movement are usually superimposed on each other, so that the vertical size of the motion device is too large. Compared with the prior art, the vertical size of the motion device of the present invention is significantly reduced, and with the application of the magnetic levitation gravity offsetting device, the vertical movement precision of the motion device is significantly improved.

EMBODIMENTS

Figure 1:
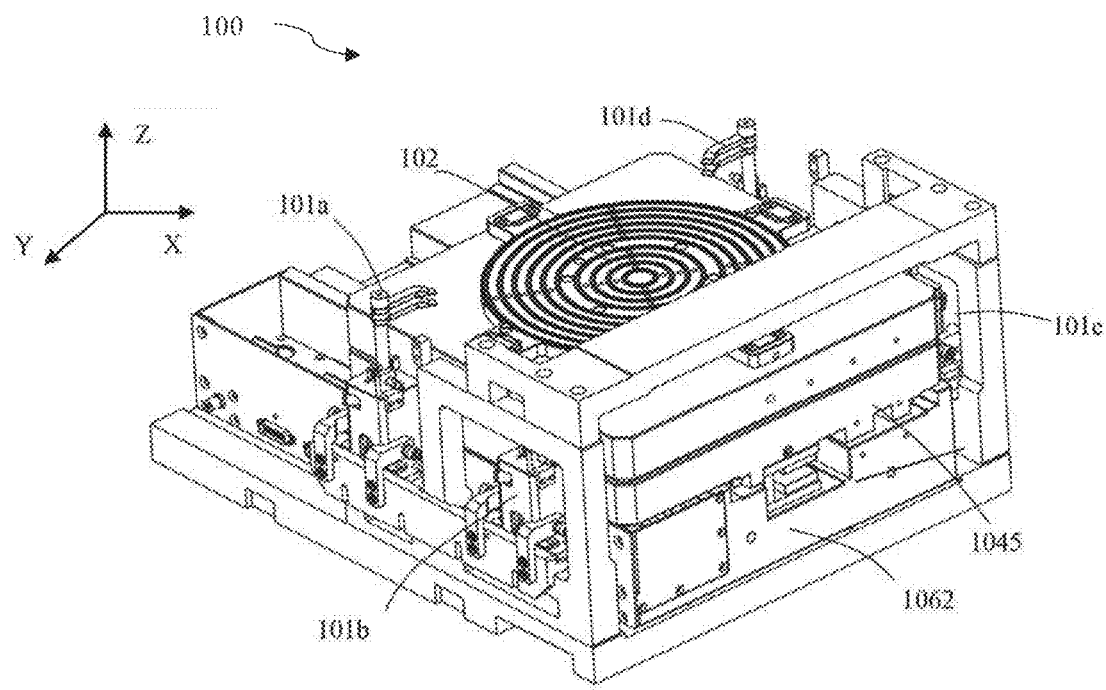
FIG. 1 is a perspective view of a motion device according to the present invention.

The preferred embodiment of this invention will be described in detail with reference to the accompanying drawings, so that the purposes, the characteristics and the advantages of the invention can be more clearly understood. It should be understood that the embodiments shown in the figures are not intended to limit the scope of this invention, but illustrate the essential spirit of the technical solution of this invention.

In the following description, certain specific details are set forth for purposes of illustrating the various disclosed embodiments to provide a thorough understanding of the various disclosed embodiments. However, those skilled in this art will recognize that embodiments may be practiced without one or more of these specific details. In other instances, well-known devices, structures, and techniques associated with the present application may not be shown or described in detail to avoid unnecessarily obscuring the description of the embodiments.

Unless otherwise desired by context, throughout the specification and claims, the terms "comprising" and variations thereof, such as "containing" and "having", are to be construed as non-exclusive, i.e., to be construed as "comprising, but not limited to"

Throughout the specification "one embodiment" or "one embodiment" means that a particular feature, structure, or characteristic described in connection with the embodiment is included in at least one embodiment. Therefore, the presence of "in one embodiment" or "in one embodiment" at various locations throughout the specification need not all refer to the same embodiment. Additionally, particular features, structures, or features may be combined in any manner in one or more embodiments.

The singular forms "a" and "said" as used in the specification and appended claims include plural references unless the context clearly dictates otherwise. The term "or" be used in its usual sense including "and/or" unless the context clearly dictates otherwise.

In the following description, for clarity of illustration of the structure and mode of operation of the present invention, various directional terms will be used to describe the present invention, but words such as "front", "rear", "left", "right", "outer", "inner", "outward", "inward", "upper", "lower", and the like, should be understood as convenient terms and should not be construed as limiting terms.

The motion device 100 according to the present invention will now be described with reference to the accompanying drawings. As shown in FIGS. 1-8, this embodiment discloses a motion device 100 including a wafer loading and unloading device, a tray 102, a rotary stage 103, a vertical movable device 104, a magnetic levitation gravity offsetting device 105, a horizontal movable device 106, a bracket 108, a horizontal base 1062, and a vertical base 1045.

The wafer loading and unloading device is fixed on a bracket 108 of the motion device. The wafer loading and unloading device is used to complete the transfer of silicon wafers together with an external robot (not shown) and the tray 102. As shown in FIG. 1, the wafer loading and unloading device includes four wafer transferring chucks 101a, 101b, 101c, and 101d. The wafer loading and unloading device receives and transfers the silicon wafers to be measured from the external robot to the tray 102 through the four wafer transferring chucks 101a, 101b, 101c, and 101d, and transfers the measured wafers from the tray 102 to the external robot.

Figure 2:
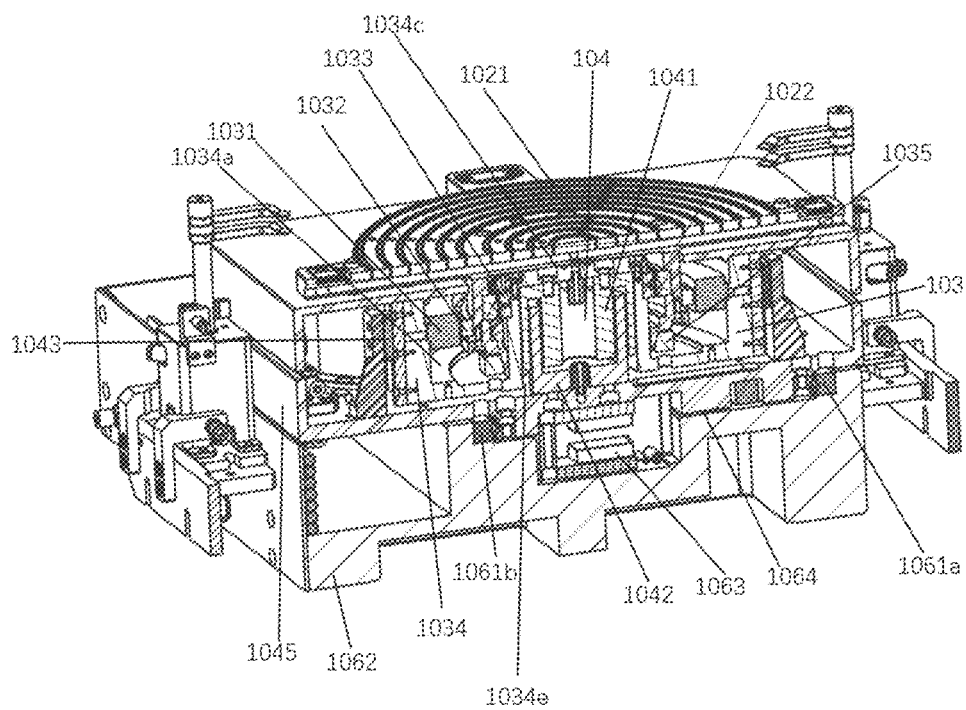
FIG. 2 is a cross-sectional view of the motion device according to the present invention.
Figure 3:
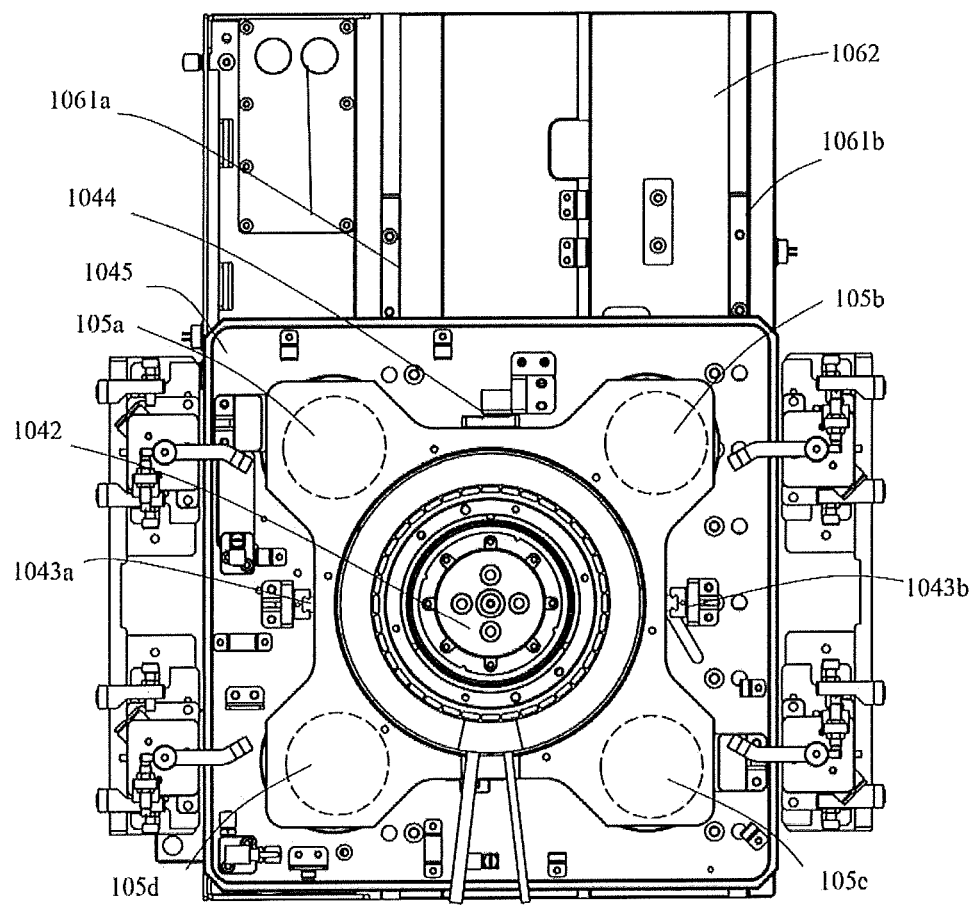
FIG. 3 is a top view of the motion device according to the present invention with the tray removed.

In the embodiment shown in FIG. 2, the tray 102 includes a suction chuck 1021 and a suction chuck base 1022 and is used to fix silicon wafers. In this embodiment, the tray 102 is a vacuum suction chuck, a disc-shaped suction chuck 1021 is provided with vent holes communicated with a vacuum supply below it, so the silicon wafer can be fixed on the suction chuck 1021 by vacuum suction. However, it should be understood that the tray 102 can also fix the silicon wafers on the suction chuck 1021 in other ways, for example, the silicon wafer can be fixed by clamping the periphery of the silicon wafer by clamping claws.

As shown in FIG. 2, the rotary stage 103 is arranged under the tray 102 and can drive the tray 102 to rotate around the central axis. The motion device 100 further includes a rotary motor which comprising a stator 1031 of the rotary motor and a rotor 1032 of the rotary motor. The rotary stage 103 includes: a bearing 1033, a rotary stage base 1034, and a rotation grating scale 1035.

Figure 6:
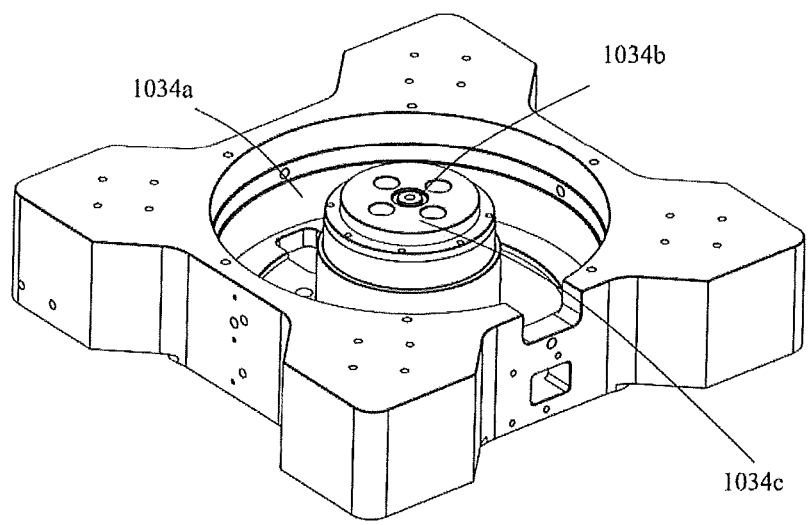
FIG. 6 is a top perspective view of the base of the rotary stage according to the present invention.
Figure 7:
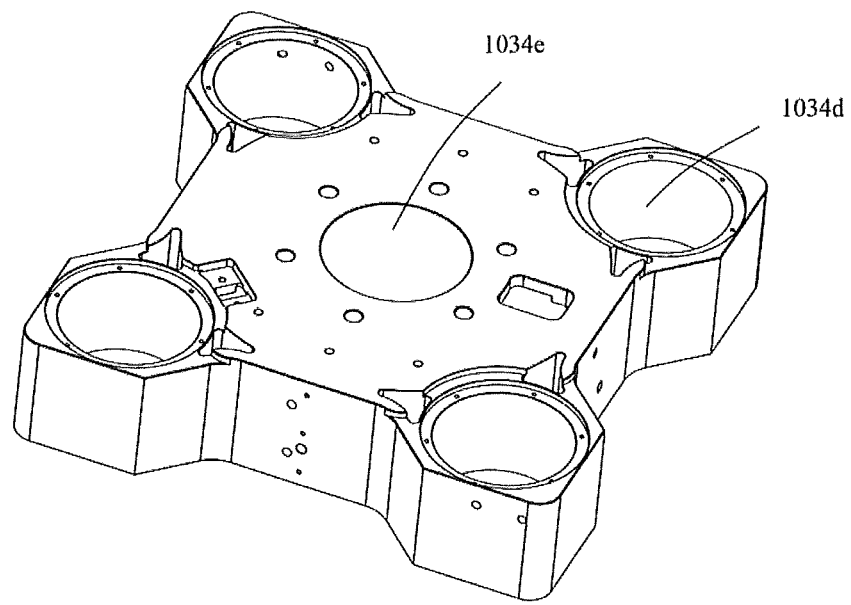
FIG. 7 is a bottom perspective view of the base of the rotary stage according to the present invention.

FIG. 6 and FIG. 7 show the specific structure of the rotary stage base 1034. As shown in FIG. 6, the rotary stage base 1034 has a substantially rectangular parallelepiped shape, specifically a rectangular parallelepiped with a substantially square horizontal cross-section. However, it should be understood that the shape of the rotary stage base 1034 is not limited to the above-mentioned shape, but can be set as required. An upper annular cavity 1034a is provided on the upper surface of the rotary stage base 1034, and a lower cavity (as described below) is provided on the lower surface. The projections of the above-mentioned upper annular cavity 1034a and the lower cavity in the direction perpendicular to the upper surface of the rotary stage base 1034 are not overlapped with each other, so that the upper annular cavity 1034a and the lower cavity can be arranged at the same vertical height, which can significantly reduce the vertical size of the rotary stage base 1034. This structure of the rotary stage base 1034 effectively reduces the vertical height of the entire motion device.

Specifically, the inner and outer peripheral walls of the upper annular cavity 1034a are cylindrical. A circular surface 1034c is formed around the top of the inner peripheral wall. In the case where the tray 102 is used to fix the silicon wafer by vacuum suction, a tray air supply hole 1034b is formed on the circular surface.

As shown in FIG. 7, a lower cavity is provided on the lower surface of the rotary stage base 1034. The lower cavity includes a magnetic levitation gravity offsetting device cavity 1034d and a vertical voice coil motor cavity 1034e. In particular, in this embodiment, the four corner positions between the outer peripheral contour of the rotary stage base 1034 and the aforementioned upper annular cavity 1034a are respectively provided with magnetic levitation gravity offsetting device cavities 1034d for accommodating the magnetic levitation gravity offsetting devices 105. A vertical voice coil motor cavity 1034e is provided in the center of the lower surface of the rotary stage base 1034 corresponding to the area surrounded by the inner peripheral wall of the upper annular cavity 1034a.

Referring again to FIG. 2, the stator 1031 of the rotary motor is cylindrical in shape with a certain wall thickness and is accommodated and fixed in the upper annular cavity 1034a of the rotary stage base 1034. The rotary stage base 1034 is located below the tray 102, and the circular surface 1034c surrounded by the top of the inner peripheral wall of the upper annular cavity 1034a is used to bear the tray 102. The rotor 1032 of the rotary motor is also accommodated in the upper annular cavity 1034a and located inside the inner periphery of the stator 1031 of the rotary motor. The rotor 1032 of the rotary motor is fixedly connected to the suction chuck base 1022. The rotor 1032 of the rotary motor can rotate with respect to the stator 1031 of the rotary motor to drive the suction chuck base 1022 which in turn drives the tray 102 to rotate, and the rotation grating scale 1035 provides a rotation position signal. The rotation grating scale 1035 is arranged in the upper annular cavity 1034a of the rotary stage base 1034, and is located at the lower end of the rotor 1032 of the rotary motor, so that the rotation position of the rotor of the rotary motor can be detected by reading the position data of the rotation grating scale 1035, therefore the rotation position of the tray 102 can also be detected. Since the rotation grating scale 1035 is arranged in the upper annular cavity 1034a, there is no need to install the grating scale on the upper surface of the stage, thereby the structure of the motion device can be made more compact. The bearing 1033 is arranged between the rotor 1032 of the rotary motor and the rotary stage base 1034 to provide rotation guidance for the rotary stage. In the present invention, since the rotary stage base 1034 can be made lowered and the height of the upper annular cavity 1034a can be reduced, only one bearing 1033 is enough to realize the rotation between the rotor 1032 of the rotary motor and the stator 1031 of the rotary motor. The reduction in the number of bearings further renders the structure of the entire motion device more compact. As shown in FIG. 2, the vertical movable device 104 is located in the vertical voice coil motor cavity 1034e on the lower surface of the rotary stage base 1034, and bears the rotary stage base 1034. In this embodiment, the vertical movable device 104 includes: a voice coil motor mover 1041, a voice coil motor stator 1042, a vertical guider 1043, a vertical grating scale 1044, and a vertical base 1045 (see FIG. 3). The voice coil motor stator 1042 is fixed on the vertical base 1045, the voice coil motor mover 1041 is provided around the voice coil motor stator 1042 and can move vertically with respect to the voice coil motor stator 1042, the voice coil motor mover 1041 and the rotary stage base 1034 is fixedly connected to drive the rotary stage 103 to move vertically, and the vertical grating scale 1044 provides a vertical position signal. In the illustrated embodiment, the vertical grating scale 1044 is arranged around the rotary stage base 1034 and placed vertically, so as to determine the vertical position of the rotary stage base 1034 and the born tray 102.

Figure 8:
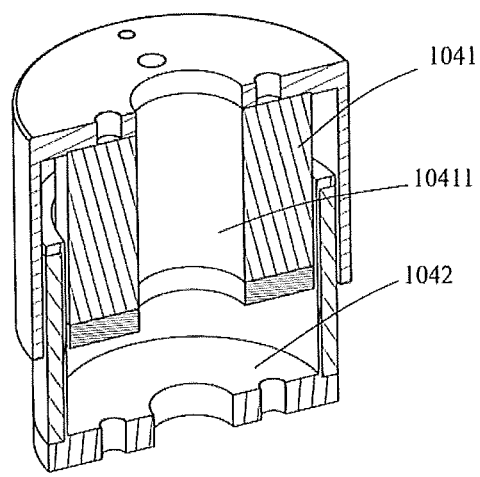
FIG. 8 is a cross-sectional view of the voice coil motor of a precise motion device according to the present invention.

FIG. 8 specifically shows the structure of the voice coil motor. The voice coil motor stator 1042 has a cylindrical hollow structure. The voice coil motor mover 1041 is cylindrical in shape, and its lower surface is provided with a central through hole 10411 and a ring cavity, the ring cavity is used to accommodate the cylindrical wall of the voice coil motor stator 1042. When the tray 102 is a vacuum suction tray, the central through hole 10411 provides installation space for the vacuum pipeline. It should be understood that the vertical movable device 104 may alternatively be provided as other linear movable devices such as hydraulic movable devices without departing from the scope of the present invention.

A vertical guider 1043 is provided between the rotary stage base 1034 and the horizontal base 1062. In the embodiment shown in FIG. 3, a total of two vertical guiders 1043a, 1043b are provided between the rotary stage base 1034 and the vertical base 1045 that are substantially rectangular parallelepiped. Each vertical guider includes a guiding rail and a slider, which are respectively fixed on the rotary stage base 1034 and the vertical base 1045 to provide a guiding function for vertical movement, so that the rotary stage base 1034 and the tray 102 born by the rotary stage base can be moved vertically with respect to the vertical base 1045.

Figure 4:
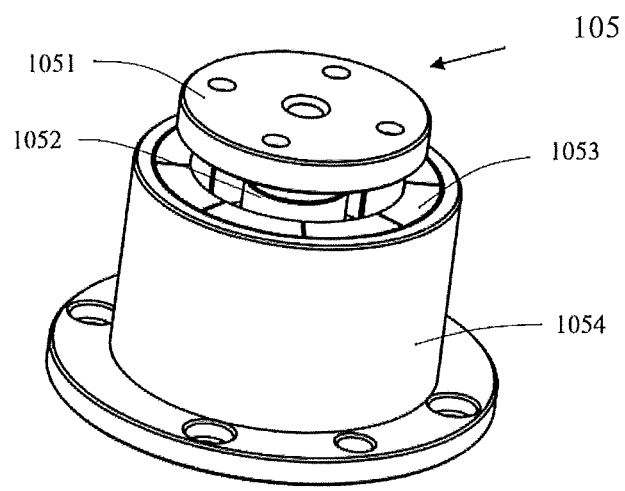
FIG. 4 is a perspective view of the magnetic levitation gravity offsetting device according to the present invention.
Figure 5:
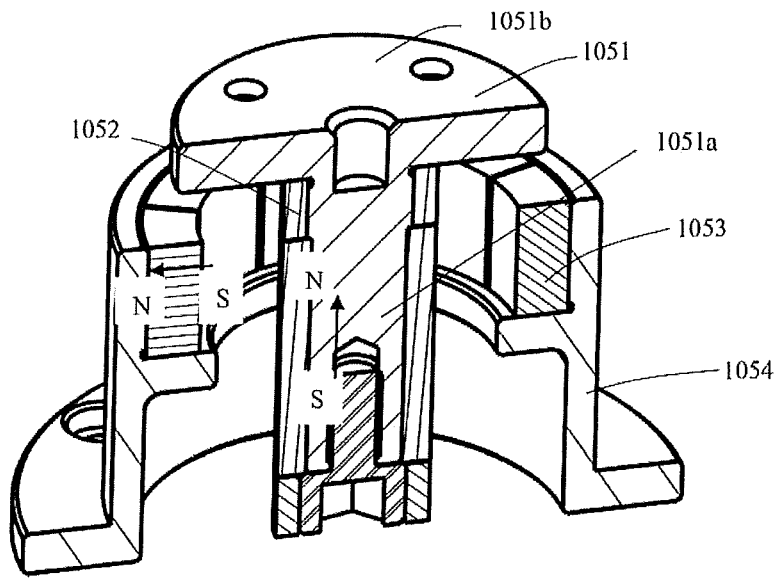
FIG. 5 is a cross-sectional view of the magnetic levitation gravity offsetting device according to the present invention.

In this embodiment, four groups of magnetic levitation gravity offsetting devices 105 are respectively arranged in the magnetic levitation gravity offsetting device cavities 1034d in the four corners of the rotary stage base 1034 to provide gravity offsetting for the vertical voice coil motor and improve vertical movement precision. As shown in FIGS. 4 and 5, the magnetic levitation gravity offsetting device 105 includes: an inner magnetic ring support 1051, an inner magnetic ring 1052, an outer magnetic ring 1053, and an outer magnetic ring seat 1054. The inner magnetic ring support 1051 includes a cylindrical rod portion 1051a and a disc-shaped head 1051b on the top of the rod portion. The inner magnetic ring 1052 is fitted over the outer peripheral surface of the cylindrical rod portion 1051a of the inner magnetic ring support 1051. And the disc-shaped head 1051b is in contact with the top of the magnetic levitation gravity offsetting device cavity 1034d, and bears the rotary stage base 1034. The outer magnetic ring seat 1054 is cylindrical, and the outer magnetic ring 1053 is embedded in the inner surface of the outer magnetic ring seat 1054. An annular gap is formed between the inner magnetic ring 1052 and the outer magnetic ring 1053. The magnetic pole direction of the inner magnetic ring 1052 is upward in the axial direction (Z direction), while the magnetic pole direction of the outer magnetic ring 1053 is radially outward. However, it should be understood that the magnetic pole direction of the inner magnetic ring 1052 can be axially downward, while the magnetic pole direction of the outer magnetic ring 1052 can be radially inward. Through the magnetic force between the inner magnetic ring 1052 and the outer magnetic ring 1053, the inner magnetic ring bracket 1051 can be pushed up, thereby exerting an upward lifting force on the top surface of the magnetic levitation gravity offsetting device cavity 1034*d*, making the lifting force approximately equal to the gravity of the rotary stage base 1034 and other devices born by the rotary stage base 1034, such as the driving motor of the rotary stage and the tray.

The air levitation gravity offsetting device is not shown in the figures. The device uses pressurized air to exert an upward lifting force on the top surface of the levitation gravity offsetting device cavity 1034*d*, so that the lifting force is approximately equal to the gravity of the rotary stage base 1034 and other devices born by the rotary stage base 1034, such as the driving motor for the rotary stage and the tray.

As shown in FIGS. 1 and 2, the horizontal movable device 106 includes: two horizontal guiders 1061*a* and 1061*b*, a horizontal base 1062, a horizontal linear motor 1063 and a horizontal grating scale 1064. The mover and stator of the horizontal linear motor 1063 are respectively fixed on the horizontal base 1062 and the vertical base 1045 to provide horizontal movement for the vertical base 1045. The horizontal base 1062 is fixedly connected to the bracket 108. The horizontal grating scale 1064 provides a horizontal position signal for horizontal movement. In the illustrated embodiment, the horizontal grating scale 1064 is arranged on the lower side of the vertical base 1045, but it should be understood that the horizontal grating scale 1064 can be arranged at any position as long as the horizontal movement signal of the vertical base 1045 can be obtained. The voice coil motor stator 1042 of the vertical movable device 104 is fixed on the vertical base 1045 to provide support for the rotary stage 103. Two horizontal guiders 1061*a* and 1061*b* are fixed on both sides of the bracket 108 and are located between the bracket 108 and the horizontal base 1062 to provide guidance for horizontal movement. The horizontal guiders 1061*a* and 1061*b* include a guiding rail and a slider sliding on the guiding rail. The guiding rail and the slider are respectively arranged on the bracket 108 and the horizontal base 1062.

Figure 9:
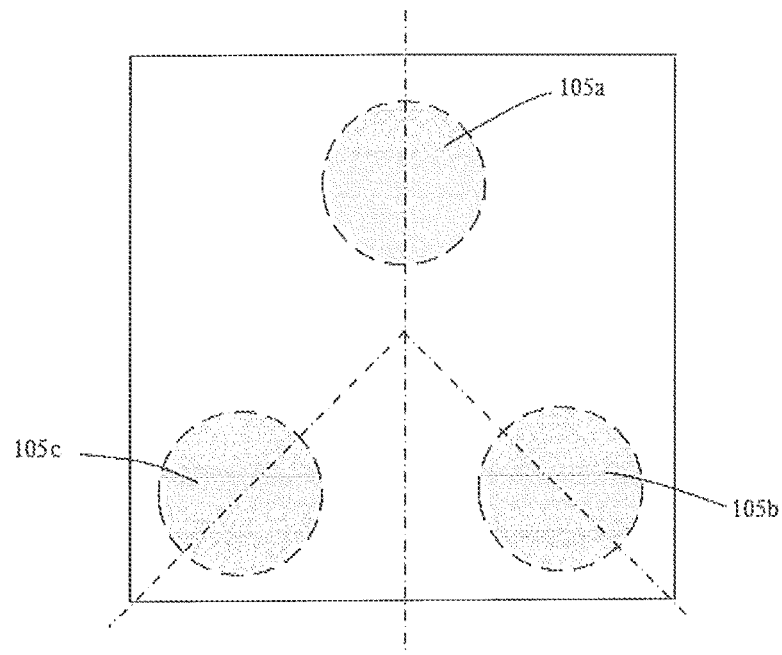
FIG. 9 is another embodiment of the layout of a magnetic levitation gravity offsetting device according to the present invention.

In the above embodiment, four magnetic levitation gravity offsetting devices 105 are used to be arranged at the four corners of the rotary stage base 1034. However, a triangular layout may also be adopted as in the embodiment shown in FIG. 9, preferably a 120° equiangular layout. That is, the rotary stage base 1034 is provided with three magnetic levitation gravity offsetting device cavities 1034*d*, which are used to accommodate the magnetic levitation gravity offsetting devices 105*a*, 105*b*, 105*c*, respectively.

Figure 10:
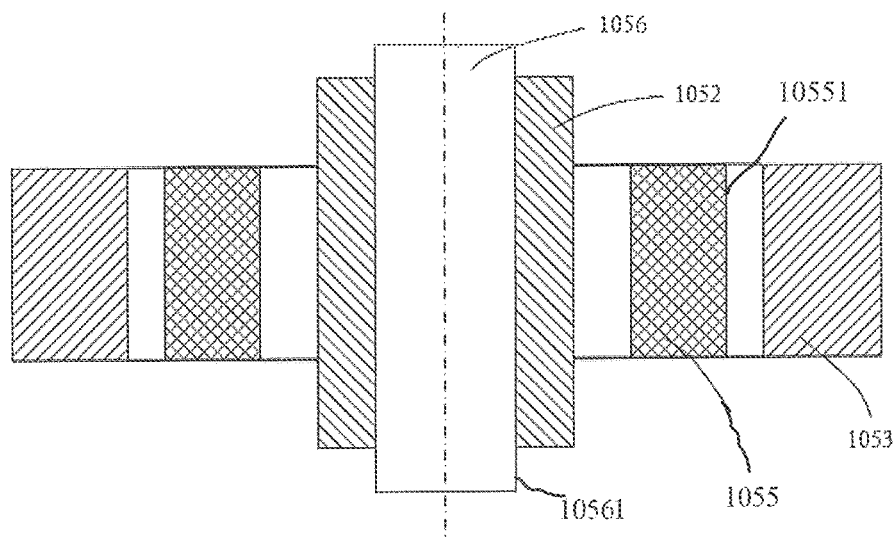
FIG. 10 is yet another embodiment of a magnetic levitation gravity offsetting device according to the present invention.

FIG. 10 shows another modified embodiment of the present invention. In the foregoing two embodiments, the voice coil motor and the levitation gravity offsetting device 105 are two separate devices. The voice coil motor is arranged in the center of the rotary stage base 1034 and pushes the rotary stage and the tray 102 along the Z axis direction. The levitation gravity offsetting devices 105 (four-corner arrangement or triangular arrangement) arranged on the outer periphery provide gravity offsetting for the voice coil motor. However, this embodiment adopts an integrated structure in which a voice coil motor and a levitation gravity offsetting device 105 are combined, and is arranged in the center of the rotary stage base 1034. As shown in FIG. 10, an inner magnetic ring 1052 is fitted over the outer surface 10561 of the voice coil motor stator 1056, and an outer magnetic ring 1053 is fitted over the outer circumference 10551 of the motor coil 1055. Therefore, the voice coil motor stator 1056 also functions as an inner magnetic ring support, and the motor coil 1055 also functions as an outer magnetic ring support. Therefore, on one hand, the integrated structure can generate levitation force through the magnetic force between the inner magnetic ring 1052 and the outer magnetic ring 1053 to offset the gravity born by the voice coil motor, and on the other hand, it can generate the Lorentz force through the coil cutting magnetic field to provide the vertical movement driving force for the rotary stage and the tray 102 moving in the Z direction.

The preferred embodiments of the present invention have been described in detail above, but it should be understood that, if necessary, aspects of the embodiments can be modified to adopt aspects, features, and concepts of various patents, applications, and publications to provide additional embodiments.

Considering the detailed description above, these and other variations can be made to the embodiments. Generally, in the claims, the terms used should not be construed as limiting the specific embodiments disclosed in the specification and claims, but should be construed to include all possible embodiments together with all equivalents to which these claims entitled.

The invention claimed is:

1. A motion device, comprising:
a tray;
a rotary stage, positioned below the tray, wherein
an upper surface of the rotary stage is provided with an annular upper cavity,
a lower surface of the rotary stage is provided with a lower cavity, wherein further
projections of the annular upper cavity and the lower cavity in a projection direction perpendicular to the upper surface of the rotary stage do not overlap each other;
a rotary motor, accommodated in the annular upper cavity, the rotary motor comprising:
a rotor of the rotary motor, and
a stator of the rotary motor,
the stator of the rotary motor being fixed with respect to the rotary stage, and
the rotor of the rotary motor being fixed with respect to the tray;
a vertical movable device, located in the lower cavity and configured to drive the rotary stage to move vertically;
a magnetic levitation gravity offsetting device, located in the lower cavity and configured to offset the gravity of the rotary stage, the magnetic levitation gravity offsetting device comprising:
an inner magnetic ring support,
an inner magnetic ring, an outer magnetic ring, and
an outer magnetic ring seat, wherein
the inner magnetic ring support comprises:
a cylindrical rod portion, and
a disc-shaped head on the top of the rod portion,
the inner magnetic ring is fitted over the outer peripheral surface of the cylindrical rod portion of the inner magnetic ring support,
the outer magnetic ring seat is cylindrical,
the outer magnetic ring is embedded in the inner surface of the outer magnetic ring seat,
an annular gap is formed between the inner magnetic ring and the outer magnetic ring; and
the magnetic pole direction of the inner magnetic ring is upward in the axial direction, and the magnetic pole direction of the outer magnetic ring is radially outward, or the magnetic pole direction of the inner magnetic ring is downward in the axial direction and the magnetic pole direction of the outer magnetic ring is radially inward.

2. The motion device according to claim 1, wherein the vertical movable device and the magnetic levitation gravity offsetting device are integrated with each other and are located in the lower cavity.

3. The motion device according to claim 1, wherein the lower cavity includes a plurality of lower cavities, and the vertical movable device and the magnetic levitation gravity offsetting device are respectively located in different ones of the plurality of lower cavities.

4. The motion device according to claim 3, wherein the plurality of lower cavities comprises:
a central cavity, and
peripheral cavities,
a plane position of the central cavity is surrounded by the annular upper cavity and is used for accommodating the vertical movable device;
the peripheral cavities are disposed on an outer periphery of the annular upper cavity and is used for accommodating the magnetic levitation gravity offsetting device.

5. The motion device according to claim 1, wherein the motion device further comprises:
a wafer loading and unloading device configured to:
place a workpiece on the tray, or
remove the workpiece from the tray.

6. The motion device according to claim 1, wherein the vertical moveable device comprises a voice coil motor that is a hollow structure, and
the tray is a vacuum chuck device.

7. The motion device according to claim 4, wherein the lower cavity includes four peripheral cavities,
each of the four peripheral cavities accommodating one of a plurality of the magnetic levitation gravity offsetting devices.

8. The motion device according to claim 2, wherein a structure in which the vertical moveable device and the magnetic levitation gravity offsetting device are integrated with each other comprises:
a voice coil motor stator, wherein further
the outer surface of the voice coil motor stator is surrounded with an inner magnetic ring; and
a voice coil motor mover,
the outer surface of the voice coil motor mover is surrounded with an outer magnetic ring.

9. The motion device according to claim 1, wherein the rotary stage comprises:
a rotation grating scale located in the annular upper cavity.

10. The motion device according to claim 1, wherein the rotary stage comprises:
one bearing provided between the rotor of the rotary motor and an inner peripheral wall of the annular upper cavity.

* * * * *